United States Patent [19]  
Eichen et al.

[11] Patent Number: 5,016,960
[45] Date of Patent: May 21, 1991

[54] HYBRID OPTICAL Y-JUNCTION

[75] Inventors: Elliot Eichen, Arlington; Paul Melman, Newton, both of Mass.

[73] Assignee: GTE Laboratories Incorporated, Waltham, Mass.

[21] Appl. No.: 455,526

[22] Filed: Dec. 22, 1989

[51] Int. Cl.⁵ .............................................. G02B 6/26
[52] U.S. Cl. ............................. 350/96.15; 350/96.12; 350/96.13
[58] Field of Search ............... 350/96.12, 96.13, 96.14, 350/96.15

[56] References Cited

U.S. PATENT DOCUMENTS

| 4,223,977 | 9/1980 | Papuchon et al. | 350/96.12 X |
| 4,653,849 | 3/1987 | Boirat et al. | 350/96.15 X |
| 4,794,346 | 12/1988 | Miller | 372/45 X |

OTHER PUBLICATIONS

O'Mahoney "Semiconductor Laser Optical Amplifiers for Use in Future Fiber Systems", J. Lightwave Tech. LT-4, pp. 531-544 (1988).
Martin "A New Waveguide Switch/Modulator for Integrated Optics", Appl. Phys. Lett., 36 pp. 562-564 (1975).
Johnson et al. "Low-Loss GainAsP Buried-Heterostructure Optical Waveguide Branches and Bends", Appl. Phys. Lett. 44 pp. 278-280 (1984).
Izutsu et al. "Picosecond Signal Sampling and Multiplication by Using Integrated Tandem Light Modulators", J. Lightwave Tech. LT-1, pp. 285-289 (1983).
Becker et al., "2-Bit 1 Gsample/s Electrooptic Guidewave Analog-to-Digital Converter", IEEE J. Quantum Electron. QE-18, pp. 1411-1413 (1982).
Lattes et al., "An ultrafast All-Optical Gate", IEEE J. Quantum Electron, QE-19, pp. 1718-1723 (1983).
Duthie "New Architecture for Large Integrated Optical Switch Arrays", Typical Meeting on Photonic Switching, Incline Village, Nevada (1987).
Ikeda "Tabdem Switching Characteristics for Laser Diode Optical Switches", Elec. Letters, vol. 21, No. 6, pp. 252-254 (1985).

Primary Examiner—John D. Lee
Assistant Examiner—Stephen W. Barns
Attorney, Agent, or Firm—Victor F. Lohmann, III

[57] ABSTRACT

A hybrid optical Y-junction device includes a 1×N optical fiber coupler connected to N waveguide structures fabricated on a single substrate. When the waveguide structure is a semiconductor optical amplifier, the hybrid Y-junction device is operable as either a modulator or lossless power divider. A nonblocking optical switch is constructed by coupling M×1 optical fiber couplers to the outputs of the waveguide structures in the hybrid Y-junction. The switch is also effective as a wavelength division multiplexer when periodic gratings are integrated into the waveguide amplifiers.

7 Claims, 2 Drawing Sheets

HYBRID OPTICAL Y-JUNCTION

FIELD OF THE INVENTION

This invention relates to optical components and, more particularly, to a hybrid optical Y-junction and a non-blocking optical switch.

BACKGROUND OF THE INVENTION

Low loss, single mode, optical Y-junctions consisting of planar waveguides in semiconductor or dielectric material are important components for optical communications and optical signal processing systems. Conventional devices using single-mode Y-junctions include switches (W.E. Martin, "A new waveguide switch/modulator for integrated optics," Appl. Phys. Lett., 26 pp. 562–564 (1975)), modulators (Martin, supra), samplers (M. Izutsu, H. Haga, and T. Sueta, "Picosecond signal sampling and multiplication by using integrated tandem light modulators," J. Lightwave Technol. LT-1 pp 285–289 (1983)), multipliers (Izutsu, supra), A/D convertors (R.A. Becker and F.J. Leonberger, "2-bit 1 Gsample/s electrooptic guided wave analog-to-digital converter," IEEE J. Quantum Electron. QE-18, pp 1411–1413 (1982)), and logic gates (A. Lattes et al.,"An ultrafast all-optical gate," IEEE J. Quantum Electron. QE-19, pp 1718–1723 (1983)). A significant problem associated with these devices concerns the loss of optical power in the guided mode at the Y-junction. Another difficulty relates to the coupling of optical fiber to the input and output ends of the planar waveguide.

A typical Y-junction as shown in FIG. 1 is formed by matching a single straight waveguide 10 with two other waveguides 11 and 12 that are each positioned at a half-angle $\alpha$ from the longitudinal axis of the first waveguide. The widths of the waveguides and the difference in index of refraction between the guiding and cladding layers are controlled so that the waveguides will support only one mode at a desired optical wavelength $\lambda$. Although the bend between the first waveguide and each of the angled waveguides is often discrete, other Y-junctions may have a smoothly varying radius of curvature, as disclosed by M.W. Austin in "GaAs/GaAlAs curved rib waveguides," IEEE J. Quantum Electron. QE-18, pp 795–800 (1982) or even a more complicated discrete bend. In these conventional Y-junctions, the percentage of light lost at a junction in the waveguide depends upon the difference in the indices of refraction and $\alpha$. For a single mode waveguide the loss always increases with increasing $\alpha$.

When used in optical communication and optical signal processing systems, planar waveguide devices are almost always fiber-pigtailed to conveniently couple light into and out of the waveguide structure. In particular, FIG. 1 shows a fiber input line 13 coupled to waveguide 10, and fiber output lines 14 and 15 coupled to waveguides 11 and 12, respectively. While coupling losses as low as 2 dB/facet have been reported by M. J. O'Mahony in "Semiconductor Laser Optical Amplifiers for Use in Future Fiber Systems," J. Lightwave Technol. LT-4 pp 531–544 (1988), typical coupling losses are about 5 dB/facet. Fiber coupling to the waveguide requires that the length L of the waveguide, measured from the beginning of the angled section, must satisfy the equation $L \geq d/(2 \tan\alpha)$, where d is the outer diameter of the fiber. The outer diameter of most telecommunications grade fibers is 125 $\mu$m. Another consideration is that losses due to material absorption and scattering from waveguide imperfections increase as the length increases. Since it is difficult to grow the device in view of these limitations, there is a trade-off between making a device longer to reduce the bend angle and thereby reduce the loss due to bending, and making the device shorter to reduce the intrinsic loss of the waveguide. Disadvantageously, longer waveguides suffer from increased absorption losses while shorter waveguides exhibit higher junction losses due to the larger bend angles required.

In addition to simple radiation loss at a bend in a single mode waveguide, planar waveguides with branches suffer from a number of other problems. For example, the light lost due to bending depends upon polarization state, and thus the overall device may introduce polarization dependent noise. In active (pumped) semiconductors, the index of refraction is a function of carrier density and thus the throughput of the device may depend upon signal strength (saturation), wavelength, or gain.

For particular waveguide parameters, such as those disclosed by L. M. Johnson, Z. L. Liau, and S. H. Groves, in "Lowloss GainAsP buried-heterostructure optical waveguide branches and bends," Appl. Phys. Lett. 44 pp 278–280 (1984), the angle at which half of the light is lost in a discrete bend (the 3 dB bend angle) in InGaAsP was found to be approximately 2.5°. The length of a device with a single bend of angle 2.5° would need to be at least 1.3 mm long, which is unrealistically long for conventional epitaxial growth techniques. Changing the geometry of the waveguide to a much more sophisticated bend similar to the one presented by P. D. Swanson et al. in "Low-loss semiconductor waveguide bends," Optics Letters 13 pp 245–247 (1988) can significantly increase the 3 dB bend angle to approximately 7°, which leads to a more realistic device of length $\geq$ 0.5 mm. The expected bend and material loss in other semiconductor material systems of interest (such as GaAs/GaAlAs) are expected to be similar. In dielectric materials such as LiNbO$_3$, the modes are much more loosely bound, and so half angles of less than 1° are typical. The devices fabricated from these materials are grown as bulk crystals and are very nearly transparent so that long devices on the order of a few millimeters are acceptable. Typical junction losses in practical LiNbO$_3$ devices are also approximately 3 dB.

In comparison to the energy loss experienced by a conventional Y-junction fabricated in semiconductor or dielectric materials, optical fiber couplers are able to couple light from a single fiber into two output fibers with almost no extraneous loss. For example, the extraneous loss of a good, commercially available, 1×2 optical coupler can be as low as 0.2 dB. However, it is extremely difficult to modulate the index of refraction through an electro-optic effect or to provide gain in an optical fiber. Furthermore, there is no known way to modulate either one of these parameters (refractive index or gain) at frequencies of efficiencies that approach those achievable by semiconductor or dielectric waveguides.

OBJECTS OF THE INVENTION

It is a primary object of the present invention to obviate the above-noted and other disadvantages of the prior art.

It is a further object of the present invention to provide a hybrid optical Y-junction which exhibits high gain and low junction loss.

It is a further object of the present invention to provide a hybrid optical Y-junction which is operable as a high bandwidth modulator or amplifier.

It is a yet further object of the present invention to provide a non-blocking switch constructed from hybrid optical Y-junctions that can also be used as a wavelength division demultiplexer.

SUMMARY OF THE INVENTION

In one aspect of the present invention, a hybrid optical Y-junction includes a 1×N optical fiber coupler having a single fiber input and N fiber outputs. A fiber means couples each of the N coupler outputs to a respective one of a plurality of waveguides fabricated on the same substrate. At the output of each waveguide is coupled a fiber connecting means which serves as the optical connection to other devices.

In another aspect of the present invention, a non-blocking optical switch is constructed from a plurality of the optical Y-junctions mentioned above. At the input end of the switch, a plurality of 1×N optical fiber couplers have their fiber inputs connected to a respective input port. The fiber outputs from the couplers are coupled to a respective waveguide by a first fiber means wherein the waveguides are fabricated on the same substrate. At an output end of the switch, the output of each waveguide is coupled by a second fiber means to the fiber input of one of a plurality of M×1 output optical fiber couplers. The single fiber output of each M×1 coupler is connected to an output port.

DETAILED DESCRIPTION OF THE PREFERRED EMBODIMENTS

In accordance with the present invention, optical fiber couplers are integrated with planar waveguide structures to form a novel hybrid device that combines the power efficiency of couplers with the modulation and gain capability of waveguides. The hybrid optical Y-junction is functionally equivalent to a conventional planar waveguide Y-junction, but has a number of structural and operational advantages over conventional devices.

The novel hybrid Y-junction device does not suffer from any power loss due to a bent waveguide as in conventional Y-junctions, and will provide significantly higher yields due to its ease of fabrication. In addition, the hybrid Y-junction can be used as a modulator, switch, or other signal processing device when the waveguide structure is made of a semiconductor material which can be injection pumped to provide gain. Furthermore, if the waveguide amplifier is integrated with a periodic grating to provide wavelength-dependent feedback, the hybrid device can be injection pumped to provide gain at a particular wavelength, and therefore is operable as a wavelength sensitive routing switch or demultiplexer.

Figure 2:
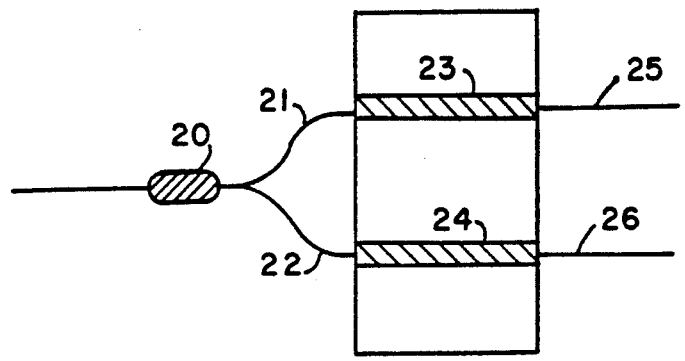
FIG. 2 shows a hybrid optical Y-junction constructed in accordance with the present invention.

FIG. 2 shows a hybrid optical Y-junction including a 1×2 fiber coupler 20 having two fiber output lines 21 and 22 coupled to two separate planar waveguides 23 and 24, respectively. Waveguides 23 and 24 are coupled at their output ends to fiber lines 25 and 26, respectively. A particularly advantageous feature of the present invention is that these waveguides are fabricated on the same substrate. The major advantage of using planar technology in fabricating the waveguides is that the gain and/or the index of refraction of the waveguides can be modulated at very high frequencies by application of a current to the waveguide with relatively low voltages and/or very high quantum efficiencies. This leads to a number of high speed switching/signal processing applications that are compatible with semiconductor laser sources and optical fibers.

If the waveguides are fabricated as semiconductor optical amplifiers, each stripe can be injection pumped to selectively turn on or off the waveguide, thereby operating as a modulator, or to provide gain. When the waveguide amplifier is off, all of the light propagating through the waveguide is absorbed due to the high transmission loss coefficient of the waveguide, which is on the order of $10^{-4}$ cm$^{-1}$. Alternatively, when the amplifier is injection pumped, the amplifier is capable of achieving variable gain. As with any semiconductor amplifier, some method must be used to reduce facet reflectivities, such as anti-reflection coating, tilting the waveguide with respect to the facet planes, or a combination of both methods. Care must also be taken to reduce the reflection from any fiber end that is not terminated.

Figure 1:
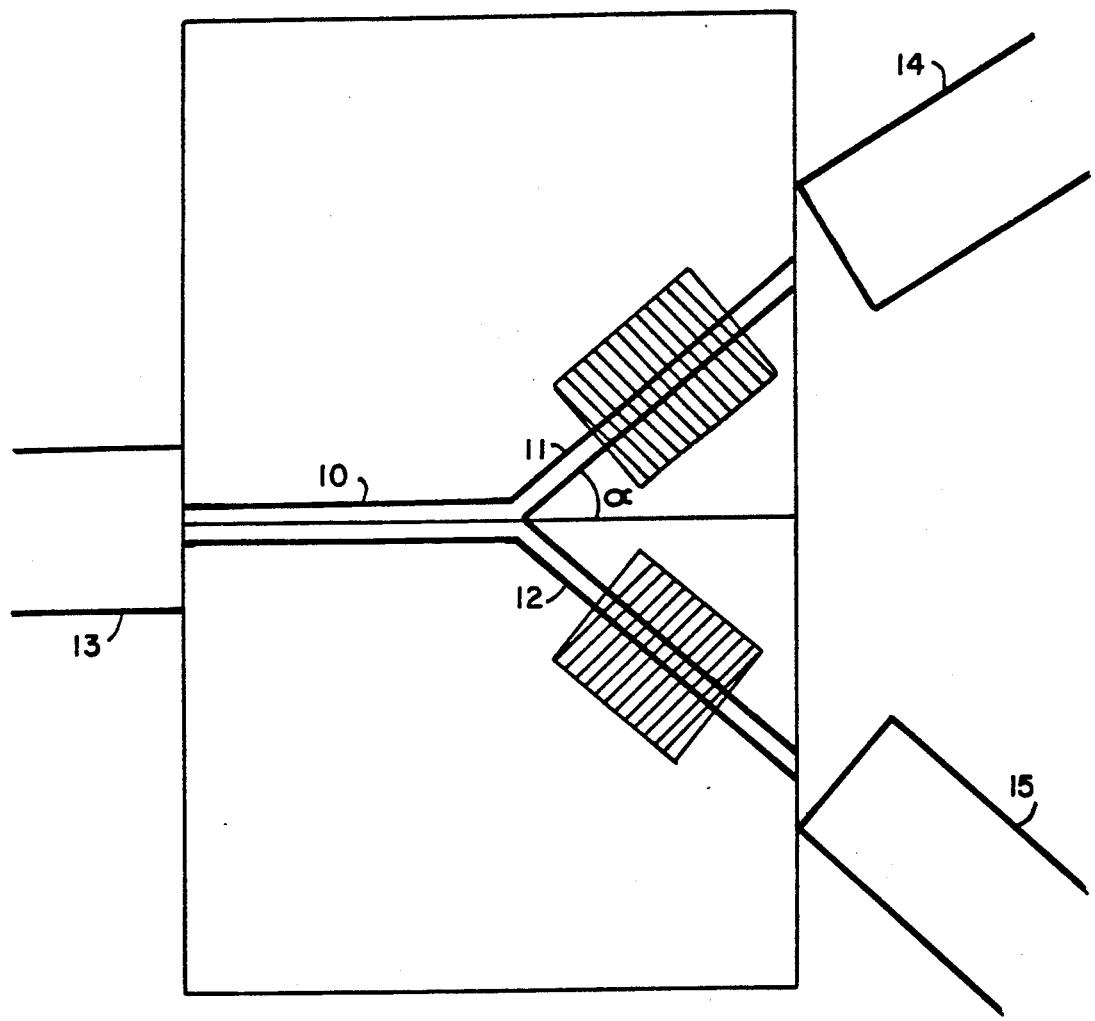
FIG. 1 is a structural diagram of a conventional optical Y-junction.

Referring to the conventional Y-junction in FIG. 1, the separation between output fibers is clearly established by the device length and bend angle, while the selective separation between waveguides in the novel hybrid Y-junction disclosed herein allows greater flexibility in fiber positioning. This greatly eases the problem of packaging, and in particular the difficultly in connecting fiber pigtails that is especially severe in multiport devices, as discussed by P. J. Duthie in "New Architecture for Large Integrated Optical Switch Arrays," Topical Meeting on Photonic Switching, Incline Village, Nev., (1987). Although the hybrid device is shown for exemplary purposes in FIG. 2 as a 1×2 optical Y-junction, the structure is clearly extendable to include a 1×N fiber coupler and N waveguide structures. This capability is useful in optical switching architectures, as explained in the following discussion of FIG. 3.

Figure 3:
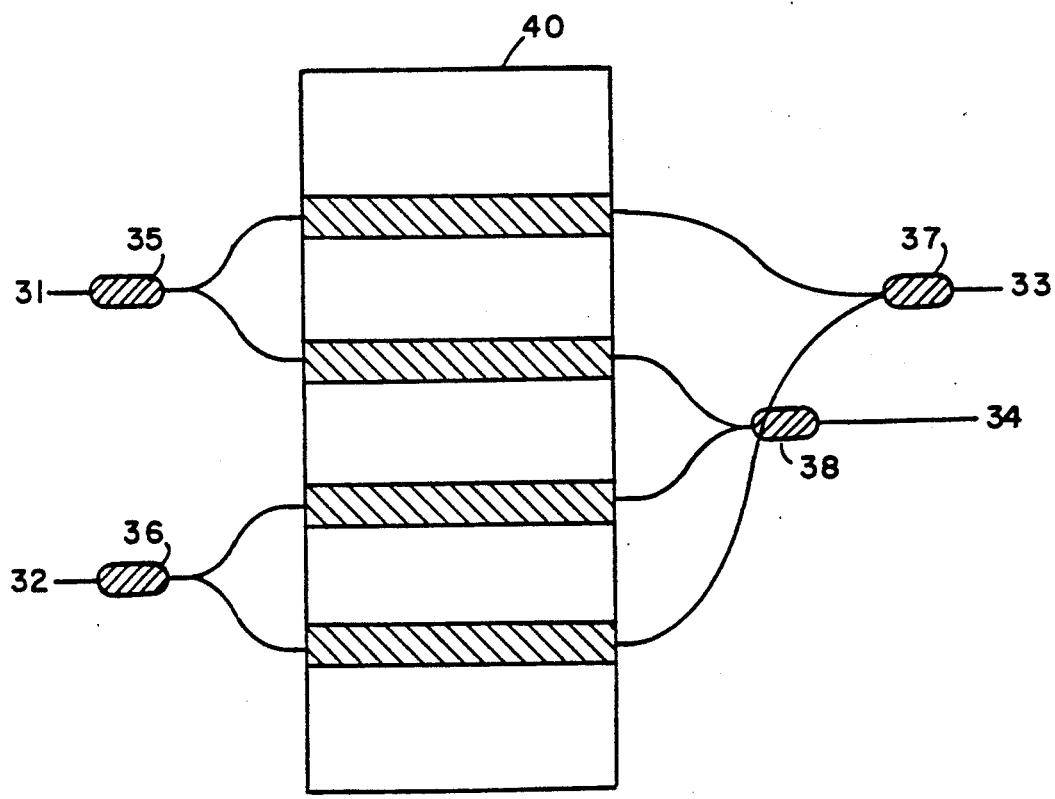
FIG. 3 is a structural representation of a 2×2 non-blocking optical switch that uses the hybrid optical Y-junction of FIG. 2.

FIG. 3 is a structural diagram of a 2×2 non-blocking optical switch constructed in accordance with the present invention. At an input end, the switch includes two 1×2 input fiber couplers 35 and 36 having their inputs connected to input ports 31 and 32, respectively. The fiber output lines from these input couplers are each coupled to a respective one of the four waveguides in array 40. Again, the waveguides are fabricated on the same substrate. At an output end, two 2×1 fiber output couplers 37 and 38 are coupled at their inputs to the output of a respective one of the waveguides in array 40. The outputs of the couplers each serve as an output port. The interconnection between array 40 and the output couplers is such that any desired optical path connection between input ports 31 and 32 and output ports 33 and 34 is possible. This hybrid device also offers high isolation (greater that 40 dB) from crosstalk, and low return power loss. In a particular embodiment, the device is operable as a wavelength division multiplexer when periodic gratings are integrated into the amplifier waveguide to provide wavelength dependent feedback.

As an extension to FIG. 3, a generalized non-blocking switch is possible where a plurality of parallel 1×N input fiber couplers are connected to a plurality of waveguides fabricated on the same substrate. At an output end of the switch, a plurality of M×1 fiber couplers serve to couple the waveguides to the output ports. A significant advantage of the novel hybrid optical Y-junction over conventional Y-junctions is that the number of possible branches is much higher. For example, consider the loss through a monolithic 8 port device, compared with a hybrid 8 port device constructed in accordance with the present invention. If each junction in the monolithic device has only a 2 dB loss (which is quite good), the total transmission loss through any one port is 6 dB, or 75%. In contrast, if the junction loss in an 8 port hybrid device is 0.5 dB (not difficult to achieve), then the total transmission loss through any one port would be 1.5 dB, or only 30%. Furthermore, a reduction in junction loss to 0.1 dB would result in a total transmission loss of 0.3 dB, or 7%, through any one port. In an optical Y-junction where the waveguide structure is a semiconductor optical amplifier, the effect of reducing the junction loss also reduces the current density required to achieve a given net single pass gain, which improves the reliability of the device. In addition to much lower intrinsic loss, a multi-port hybrid device requires a much smaller chip, which considerably reduces the demands on epitaxial or crystal growth.

What has been shown and described herein is a novel hybrid optical Y-junction formed by coupling semiconductor optical amplifiers and/or dielectric waveguide modulators fabricated on the same substrate to fiber couplers. The advantages of this device over previously existing devices are:

ease of fabrication and packaging with significantly higher yields, no radiation losses due to waveguide branching, no practical limits to the number of output branches, and reduction in polarization sensitivity or carrier density induced waveguiding.

Furthermore, if the hybrid device is fabricated with semiconductor optical amplifiers, the device can act as a lossless power divider (or a power divider with gain) when all of the amplifiers coupled to a particular fiber coupler are simultaneously pumped. Alternatively, with each amplifier waveguide selectively pumped, the device can operate as either a modulator or a non-blocking switch. The hybrid device is also operable as a wavelength division multiplexer when periodic gratings are integrated into the amplifier waveguide structures.

What is claimed is:

1. A hybrid optical Y-junction, comprising:
    a 1×N optical fiber coupler having a fiber input and N fiber outputs;
    a plurality of semiconductor optical amplifiers fabricated on a common substrate, each of said amplifiers having an input and an output;
    means for fiber coupling each of the fiber outputs of said optical fiber coupler to the input of a respective one of said amplifiers; and
    a plurality of fiber connecting means each coupled to the output of a respective amplifier.

2. The hybrid optical Y-junction as recited in claim 1 further includes:
    means for selectively pumping said amplifiers so that each amplifier is capable of achieving variable gain/loss.

3. A non-blocking optical switch, comprising:
    a plurality of 1×N input optical fiber couplers each having a fiber input connected to an input port and N fiber outputs;
    a plurality of semiconductor optical amplifiers fabricated on a common substrate, each amplifier having an input and an output;
    means for coupling each of the N fiber outputs of each input optical fiber coupler to the input of a respective one of said amplifiers;
    a plurality of N×1 output optical fiber couplers each having N fiber inputs and a single fiber output connected to an output port; and
    means for coupling the output of each amplifier to a respective fiber input of a respective one of said output optical fiber couplers;

4. The non-blocking optical switch as recited in claim 3 further includes:
    means for injection pumping said amplifiers so that an optical connection can be established between any one of said input ports and any one of said output ports.

5. A non-blocking optical switch having wavelength selectively, comprising:
    a plurality of 1×N input optical fiber couplers each having a fiber input and N fiber outputs;
    a plurality of waveguides fabricated on a common substrate, each waveguide having an input and an output;
    each waveguide being integrated with a periodic grating;
    means for coupling each of the N fiber outputs of each input optical fiber coupler to the input of a respective one of said waveguides;
    a plurality of N×1 output optical fiber couplers each having N fiber inputs and a single fiber output; and
    means for coupling the output of each waveguide to a respective fiber input of a respective one of said output optical fiber couplers.

6. The nonblocking optical switch having wavelength selectivity as recited in claim 5 wherein:
    said waveguides are semiconductor optical amplifiers.

7. The nonblocking optical switch having wavelength selectivity as recited in claim 6 further includes:
    means for injection pumping said amplifiers whereby each of said amplifiers provides gain at a particular wavelength in accordance with said respective grating.

* * * * *